(12) United States Patent
Lei

(10) Patent No.: US 7,008,867 B2
(45) Date of Patent: Mar. 7, 2006

(54) METHOD FOR FORMING COPPER BUMP ANTIOXIDATION SURFACE

(75) Inventor: Kuo Lung Lei, San Jose, CA (US)

(73) Assignee: Aptos Corporation, Milpitas, CA (US)

( * ) Notice: Subject to any disclaimer, the term of this patent is extended or adjusted under 35 U.S.C. 154(b) by 157 days.

(21) Appl. No.: 10/370,827

(22) Filed: Feb. 21, 2003

(65) Prior Publication Data

US 2004/0166661 A1 Aug. 26, 2004

(51) Int. Cl.
*H01L 21/44* (2006.01)
(52) U.S. Cl. .................. 438/613; 438/678; 438/687
(58) Field of Classification Search ............... 438/612, 438/613, 678, 687
See application file for complete search history.

(56) References Cited

U.S. PATENT DOCUMENTS

| | | | | |
|---|---|---|---|---|
| 6,107,186 A | * | 8/2000 | Erb | .............................. 438/633 |
| 6,731,003 B1 | * | 5/2004 | Joshi et al. | .................. 257/737 |
| 6,740,577 B1 | * | 5/2004 | Jin et al. | ..................... 438/612 |

* cited by examiner

*Primary Examiner*—Ha Tran Nguyen
(74) *Attorney, Agent, or Firm*—Tung & Assoc.

(57) ABSTRACT

A method for forming a copper bump for flip chip bonding having improved oxidation resistance and thermal stability including providing a copper column having a thickness of at least about 40 microns overlying a metallurgy including an uppermost copper metal layer and a lowermost titanium layer the lowermost titanium layer in contact with an exposed copper bonding pad portion surrounded by a passivation layer; and, selectively depositing at least one protective metal layer over the copper column according to an electrolytic deposition process.

12 Claims, 2 Drawing Sheets

METHOD FOR FORMING COPPER BUMP ANTIOXIDATION SURFACE

FIELD OF THE INVENTION

This invention generally relates to semiconductor processing and more particularly solder bump formation in flip chip bonding technology and a method for protecting an exposed copper surface in a copper bump from oxidation.

BACKGROUND OF THE INVENTION

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

Some chip bonding technologies utilize a copper bump attached to a contact pad (chip bond pad) on the chip to make an electrical connection from the chip to the package. For example, new packaging methods including area array mounting include BGA (Ball Grid Array) and CSP (Chip Scale Package) methods where semiconductor chips are mounted on a substrate. In flip chip bonding, bumps are usually formed beforehand on the bonding pads of a semiconductor chip and the bumps are then interfaced with the terminals located on an interconnect substrate followed by, for example, thermo-compression bonding.

For example in the liquid crystal display panel art, driver chips must be mounted on a glass substrate. A mounting technology known as "chip on glass has emerged as a cost effective technique for mounting driver chips using a flat-top metal bump, for example a copper bump. Copper bumps may be formed by, for example, electroless or electrodeposition methods of copper over layers of under bump metallization (UBM) formed over the chip bonding pad. The copper bump (column) is typically formed within a mask formed of photoresist or other organic resinous material defining the bump forming area over the chip bonding pad.

In the electroless plating method, a metal is catalytically reduced onto a plating surface without the application of a power source. However, possible combinations of the metal base and the plating liquid are limited, and a plating rate is relatively low. Therefore, the electroless plating method is frequently not suitable for formation of metal films having a thickness in the micrometer range.

In some applications is desirable to form relatively thick copper bumps, for example, to improve the bonding strength in extreme environments where the bond is subjected to extraordinary stresses. For example, it is frequently desirable to form a copper bump having a thickness (height) of about 60 microns.

One problem with using copper metal to form bumps is the tendency of copper to oxidize at the surface to form a high electrical resistance copper oxide. Approaches thus far in the prior art have been directed at electroless and immersion plating of protective layers over the copper bump. Electroless an immersion plating approaches have been used since the process is relatively easy to implement requiring a solution bath and appropriate solution chemicals.

However, electroless and immersion plating is frequently unreliable it reliability frequently being device dependent in that the surface area and topography to be plated varies from device to device. As a result, mass transport of precursors to catalytically react at the plating surface is locally affected by the surface area to be plated as well as the feature topography which affects boundary layer concentrations and diffusion at the plating surface, frequently resulting in non-uniform thicknesses of plated or immersion plated metals. Mass transport properties in an electroless plating solution have proven to be difficult to adequately control. As the size and the topography of the plated surface changes, for example with varying bump sizes and densities, the difficulty of reproducing uniform and reliable metal films increases, frequently resulting in unacceptably low yields of about 10 to about 20 percent. For example it is difficult to monitor the thickness of metal layers being deposited making deposition control difficult.

These and other shortcomings demonstrate a need in the semiconductor processing art to develop an improved method for forming copper bumps including preventing subsequent copper bump oxidation.

It is therefore an object of the invention to provide an improved method for forming copper bumps including preventing subsequent copper bump oxidation in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a copper bump for flip chip bonding having improved oxidation resistance and thermal stability.

In a first embodiment, the method includes providing a copper column having a thickness of at least about 40 microns overlying a metallurgy including an uppermost copper metal layer and a lowermost titanium layer the lowermost titanium layer in contact with an exposed copper bonding pad portion surrounded by a passivation layer; and, selectively depositing at least one protective metal layer over the copper column according to an electrolytic deposition process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In an exemplary process for forming a copper bump on a semiconductor chip, reference is made to FIGS. 1A–1F showing representational cross sectional views of a portion of a semiconductor process wafer at exemplary stages in a manufacturing process for forming a copper bump for chip bonding in flip chip bonding technology. By the term "copper" herein in meant copper or alloys thereof. For example, referring first to FIG. 1A, the process of creating the copper bumps begins after chip bonding pad 12, for example Cu or Al, has been formed in an upper portion of an uppermost dielectric insulating layer 10, also referred to as a metallization layer of a multi-layered semiconductor device, for example including alternating layers of metallization layers and dielectric isolation layers formed over a semiconductor substrate. Although not shown, preferably, electrical communication pathways, for example metal interconnect structures such as metal lines or vias are provided in metallization layer 10 to provide electrical connectivity to other portions of integrated circuitry in a multi-level semiconductor device including other surface portions of the process wafer, for example contact pads for supplying an electrical signal to the bonding pad.

Following formation of the chip bonding pad 12, a single or multiple layer passivation coating 14, for example, including at least one of silicon nitride (SiN), polyimide, Benzocyclobutene (BCD), silicon dioxide (SiO$_2$), and silicon oxynitride (e.g., SiON) is formed over the semiconductor device surface to partially overlap the chip bonding pad excluding a portion overlying the chip bonding pad 12, such that a connectivity opening area 12A is left overlying and exposing at least a portion of the chip bonding pad 12.

Figure 1A:
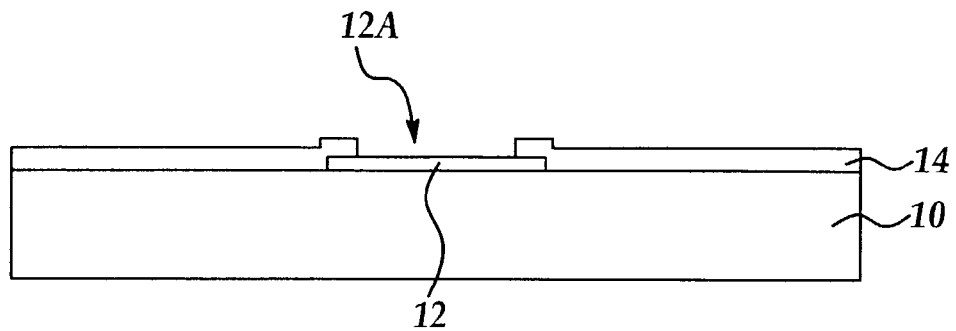
FIGS. 1A–1F are cross sectional side views of different stages in a copper bump formation process according to an exemplary embodiment of the present invention.
Figure 1B:
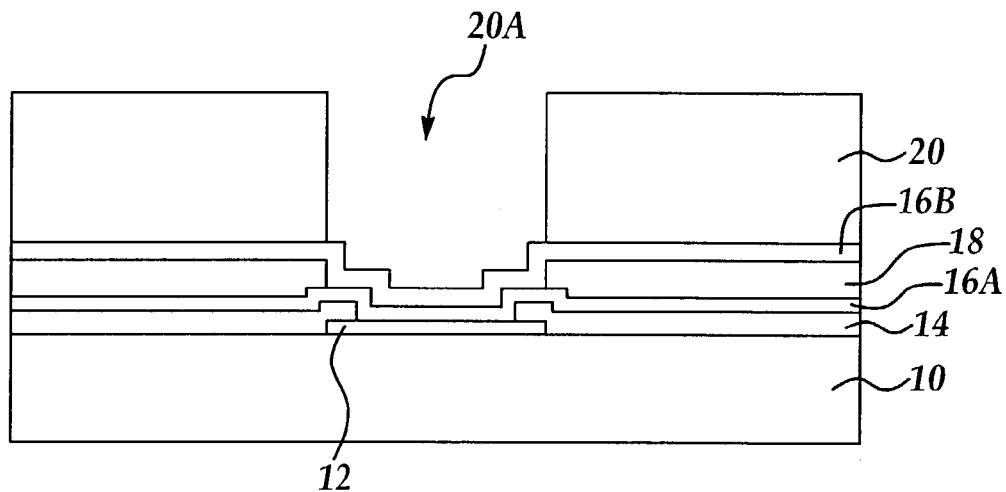

Referring to FIG. 1B, a first UBM system (metallurgy), for example including one or more under bump metallization (UBM) layers, for example at least a lowermost layer of titanium 16A is blanket deposited to a thickness of from about 500 Angstroms to about 1500 Angstroms. It will be appreciated that the first UBM system may include multiple layers such as Ti—Ni or Cr—Cu, however at least a lowermost titanium layer is preferred due to its superior stability and adhesion to the underlying passivation layer 14 and the copper bonding pad 12. A polymer layer 18 is then deposited, for example a polyimide polymer to a thickness of about 1 to about 2 microns, more preferably about 1.5 microns. The polymer layer may be either photosensitive for direct patterning and etching of an opening in the polymer layer aligned over at least a portion of the connectivity opening area 12A or non-photosensitive polymer where an overlying photoresist is deposited, patterned and etched to form an opening in the polymer layer exposing the first UBM layer and aligned over at least a portion of the connectivity opening area 12A. For example, in the latter case a subsequent anisotropic etching process is carried to etch an opening in the polymer layer such that the opening is aligned over at least a portion of the connectivity opening area 12A exposing the first UBM layer 16A for subsequent alignment of an overlying copper bump.

Still referring to FIG. 1B, a second UBM system (metallurgy) 16B is blanket deposited over the patterned polyimide layer 18, for example including a first layer of titanium deposited to a thickness of about 8000 to 12000 Angstroms followed by a layer of copper or copper alloy deposited to a thickness of about 3000 to about 5000 Angstroms. It will be appreciated that other metals may be used for the second UBM layer, for example metals providing good adhesion to the underlying first UBM metallurgy, e.g., layer 16A and good adhesion to a subsequently formed overlying copper column (bump). For example the second UBM metallurgy may include layers of Cr—Cu, or TiW—Cu. For example, the second UBM metallurgy may be a Ni—Cu system provided the underlying first UBM metallurgy includes an uppermost layer of Cu, Ni, Au or Al. Preferably the uppermost layer of the second UBM metallurgy is copper for formation of an overlying copper column by an electro-chemical deposition (ECD) method, but it will be appreciated that the uppermost layer may include a different metal such as Au, having good electrical conductivity and adhesion to an overlying deposited copper column. Most preferably, however, the underlying metallurgy includes a single layer of Ti and the second UBM metallurgy is formed of a lowermost layer of Ti and an uppermost layer of Cu since the combined metallurgy system has been found to have superior adhesion and stability for relatively thick overlying copper based bumps, for example greater than about 40 microns, and further, provides sufficient electrical conductivity for subsequent ECD processes.

Still referring to FIG. 1B a layer of photoresist 20, for example dry film photoresist is formed over the second UBM layer to a thickness of about 40 to about 70 microns, more preferably about 60 microns and photo-lithographically patterned in a conventional process to form opening 20A, preferably aligned with the opening edges in the polymer layer 18 overlying and encompassing connectivity opening area 12A.

Figure 1C:
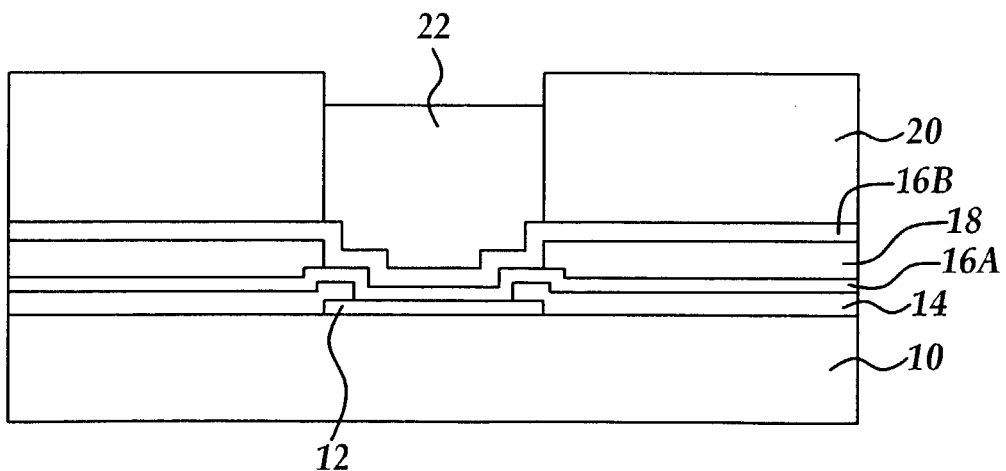

Referring to FIG. 1C, copper or an alloy thereof, for example including Mg, Zr or Be is deposited preferably by a conventional electro-chemical deposition (ECD) process using the uppermost copper portion of the second UBM metallurgy 16B as a seed layer to form a copper column 22, preferably formed at a thickness of from about 40 microns to about 70 microns. It will be appreciated that the copper column 22 may be formed by an electroless, CVD or PVD method, however these methods are less preferred due to processing inefficiencies including degraded electrical conductivity and the additional processing steps required, for example removing copper deposited overlying the opening 20A level prior to stripping the photoresist layer 20 for subsequent processing.

Figure 1D:
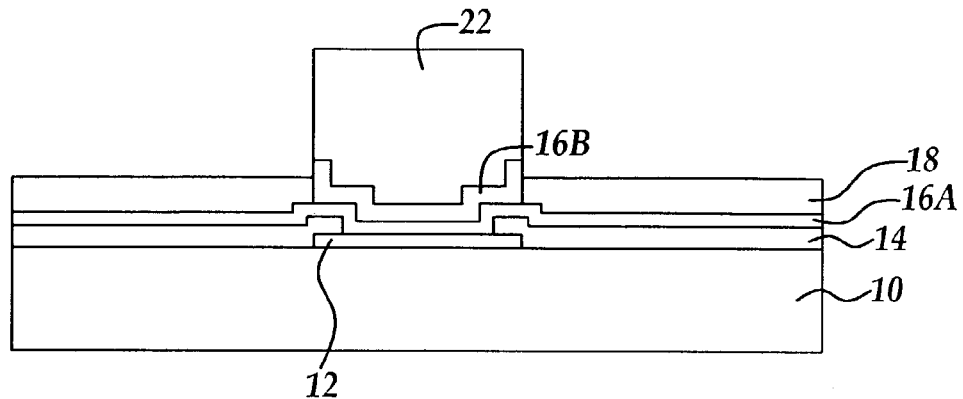

Referring to FIG. 1D, the photoresist layer 20 is then stripped by a thick film photoresist stripping process, preferably a wet stripping process leaving copper column 22. Still referring to FIG. 1D, following the resist stripping process the exposed portion of the second UBM metallurgy 16B is etched back to expose the underlying portion of polymer layer 18 in a self-aligned etchback process by a conventional wet and/or dry etching process depending on the metallurgy of the second UBM metallurgy as will be appreciated by those skilled in the art.

Figure 1E:
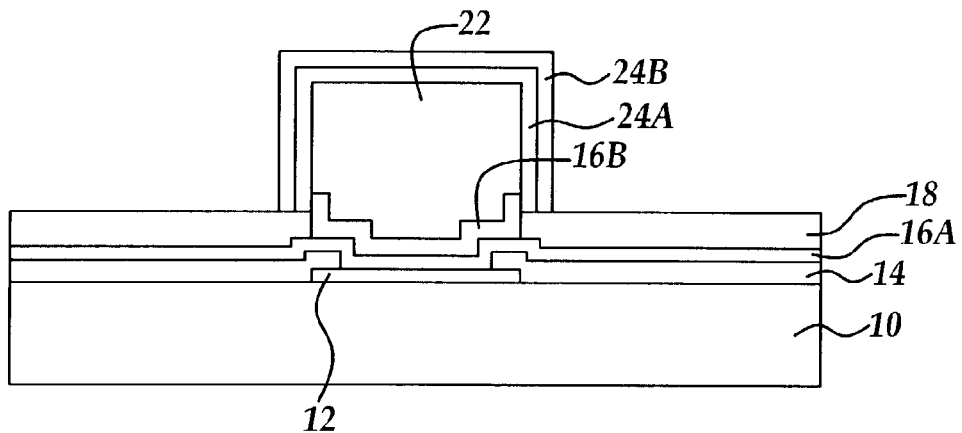

Referring to FIG. 1E, in a preferred embodiment according to the present invention, the exposed portion of the copper column 22, optionally including a remaining portion of the second UBM metallurgy along the column sidewalls, is subjected to an electrochemical deposition (ECD) process, also referred to as an electrolytic plating process or electrolysis, to deposit at least one protective metal layer over the copper column 22 including the exposed sidewall portions with at least the uppermost protective metal layer being resistant to oxidation under atmospheric conditions. As is known in the art, in an electrolytic plating process an anodic assembly is placed in spaced apart relationship to the plating surface (cathode) with an intervening electrolyte containing metal ions and power applied to induce metal plating on the plating surface. For example, electrode areas (contact pads) located at a peripheral portion of a process wafer (cathode) are used for applying cathodic voltage to the copper columns (bumps) whereby an electrical communication pathway is provided through a portion of the device integrated circuitry and through the bonding pad to the copper columns (bumps) to induce current flow through the copper columns thereby selectively reducing (plating) metal ions in the electrolyte solution onto the plating surface, e.g., the copper columns or an overlying protective metal layer previously plated by the electrolytic plating process.

Pulsed waveform or continuous electrolytic plating (electrolysis) techniques maybe suitably used according to embodiments of the invention, however, a pulsed waveform technique is frequently preferable since metal layers may be more reliably deposited, for example including periodically reversing electrode potentials at a predetermined potential and frequency to prevent the formation of metal occlusions and improve a structural stability of the deposited copper.

For example, an electrical potential between the anodic assembly and copper plating areas (cathode) is periodically altered to induce an alternating electrolyte flow between the assembly and the copper plating areas. For example, a series of pulses of DC current or voltage of a predetermined amplitude and duration (pulse width) are separated by periods of zero current. A series of pulses of DC current or voltage of a predetermined amplitude and pulse width make up a waveform which is repeated at a predetermined frequency in pulsed electrolytic plating. For example, pulsed electrolytic plating can be conducted by utilizing a waveform that is repeated at a given frequency where the current density is selectively controlled by selecting the voltage over the pulse duration. For example, a periodic DC forward cathodic voltage pulse is applied with periodically interspersed reversed anodic voltage pulses to form a reverse pulse waveform at predetermined frequencies and voltages.

An anode of the plating system may be used in an electrolytic plating process to deposit oxidation protective metal layers over the copper bump, the anode being formed of an inert metal, such as, for example, platinum or titanium or may be consumable metal formed of the protective metal layer to be deposited, the consumable anode supplying metal ions in solution to be electroplated on the copper bump. If an inert anode is employed, the metal ions for depositing the protective metal layers such as, Ni, Au, and/or alloys of these metals are separately supplied as metal ions in the electrolyte solution by metal ion precursors known in the art.

In one embodiment, referring again to FIG. 1E, the oxidation protective metal layer includes a bilayer of Ni—Au or respective alloys thereof deposited by an electrolytic deposition process (e.g., ECD) with a lowermost layer of Ni, or an alloy thereof e.g., 24A being first deposited over the copper column 22 at a thickness of about 1.5 to 2.5 microns, more preferably about 2 microns. Next, an uppermost layer of Au, or an alloy thereof e.g., 24B is deposited over the Ni layer 24A at a thickness of about 0.5 to about 1.5 microns, more preferably about 1 micron. It will be appreciated that a single layer of Au or Au alloy may be deposited over the copper column 22 to form an oxidation protective layer, however the deposition of a first Ni layer 24A is preferred since it has been found to improve adhesion and stability of the uppermost overlying Au layer 24B thereby providing improved oxidation resistance and ability to withstand more elevated temperature environments including increased levels of thermally induced stresses produced by relatively thick copper based bumps. In addition, the underlying layer of Ni improves bonding in a subsequent thermosonic, thermo compression, or solder bonding operation.

Another advantage of the present invention is that the electrolytic (ECD) process may be better controlled compared to an electroless deposition process to provide more consistent mass transport thereby forming more uniform metal films with improved adhesion and stability. In addition, depositing the oxidation protective metal layers over a copper bump by an electrolysis process provides improved throughput since the electrolysis process is relatively faster and improves the overall yield rate following conventional quality control environmental exposure and stress testing. Additional advantages of electrolysis (e.g., ECD) over electroless deposition is that the metal purity (and hence conductivity) is improved. Moreover, in the pulsed ECD plating method, the formation of metal occlusions due to high current spots can be advantageously avoided to lower film stresses. Additionally, the current flow in an electrolytic process can be advantageously monitored to determine the quantity of deposited metal which may be fed-forward to control film thicknesses in the metal deposition process.

Figure 1F:
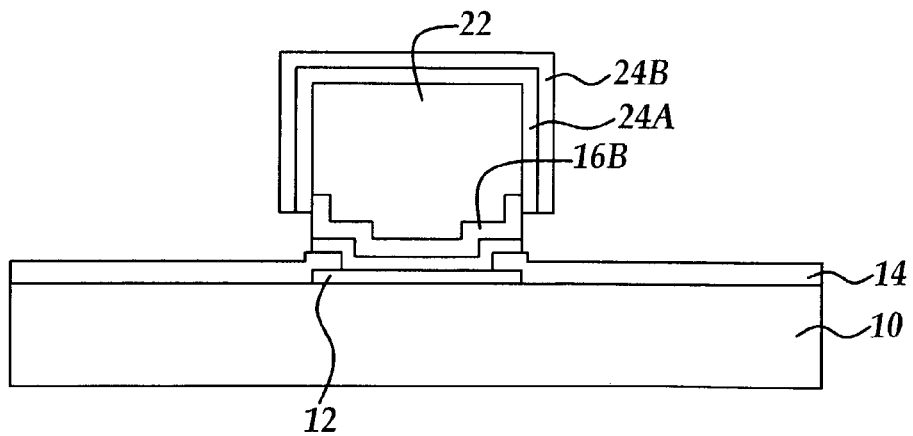

Referring to FIG. 1F, following the deposition of the bilayer oxidation resistant metal layers e.g., 24A and 24B, the exposed portion of the polymer layer 18 is stripped by a first conventional wet or dry stripping process to expose the underlying portion of the first UBM metallurgy (system) 16A followed by a second conventional etchback process, for example a wet or dry etchback process to etchback the exposed portion of the first UBM metallurgy to expose the underlying portion of the passivation layer 14.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a copper bump having improved oxidation resistance and thermal stability comprising the steps of:

providing a metal bonding pad formed over a substrate comprising electrical communication pathways;

forming a passivation layer over the substrate excepting an exposed portion of the metal bonding pad;

forming a first metallurgy over the passivation layer and contacting the exposed portion;

forming a second metallurgy overlying and contacting the first metallurgy;

forming a patterned photoresist layer over the second metallurgy patterned to provide an opening aligned to overlie the exposed portion;

depositing a copper layer to at least partially fill the opening to form a copper bump;

removing the patterned photoresist layer to expose the copper bump;

selectively depositing at least one oxidation resistant metal layer over the copper bump to cover exposed portions comprising upper and sidewall portions according to an electro-chemical deposition (ECD) process; and etching through a thickness of the first metallurgy surrounding the copper bump to expose the passivation layer following the step of selectively depositing.

2. The method of claim 1, wherein the at least one oxidation resistant metal layer comprises an uppermost layer selected from the group consisting of gold (Au), platinum (Pt), and alloys thereof.

3. The method of claim 2, wherein a nickel (Ni) containing layer is provided between the uppermost layer and the copper bump.

4. The method of claim 1, wherein the ECD process comprises one of a continuous or pulsed DC signal applied between one of an anode and cathode and a metal plating surface.

5. The method of claim 1, wherein the copper bump is formed having thickness of from about 40 microns to about 70 microns.

6. The method of claim 1, wherein the copper bump is deposited according to an ECD process.

7. The method of claim 1, wherein an uppermost metal layer of the second metallurgy comprises copper.

8. The method of claim 1, wherein the first metallurgy comprises titanium.

9. The method of claim 1, wherein the second metallurgy comprises titanium and copper.

10. The method of claim 1, wherein the ECD process comprises a reverse pulse waveform.

11. The method of claim 1, wherein the metal bonding pad is selected from the group consisting of copper, aluminum, and alloys thereof.

12. The method of claim 1, wherein the step of selectively depositing comprises selectively supplying a plating voltage to a plating surface consisting essentially of a surface overlying and contacting the copper bump.

* * * * *